(12) United States Patent
Kim et al.

(10) Patent No.: US 11,901,869 B2
(45) Date of Patent: Feb. 13, 2024

(54) AMPLIFIER CAPABLE OF MINIMIZING SHORT-CIRCUIT CURRENT OF OUTPUT STAGE WHILE HAVING IMPROVED SLEW RATE

(71) Applicant: DB HiTek Co., Ltd., Seoul (KR)

(72) Inventors: Mun Gyu Kim, Seoul (KR); Yong In Park, Hanam-si (KR)

(73) Assignee: DB HiTek, Co., Ltd., Seoul (KR)

( * ) Notice: Subject to any disclaimer, the term of this patent is extended or adjusted under 35 U.S.C. 154(b) by 78 days.

(21) Appl. No.: 17/675,144

(22) Filed: Feb. 18, 2022

(65) Prior Publication Data

US 2022/0286099 A1 Sep. 8, 2022

(30) Foreign Application Priority Data

Mar. 4, 2021 (KR) .................. 10-2021-0028927

(51) Int. Cl.
*H03F 3/45* (2006.01)
*H03F 1/52* (2006.01)

(52) U.S. Cl.
CPC ......... *H03F 3/45183* (2013.01); *H03F 1/523* (2013.01); *H03F 2203/45248* (2013.01)

(58) Field of Classification Search
CPC .............. H03F 3/45183; H03F 1/523; H03F 2203/45248; H03F 3/303; H03F 3/45219; H03F 2203/45091; H03F 2203/45182; H03F 2203/45221; H03F 2203/45676; H03F 3/45273; G09G 3/3688
USPC ....................................... 330/253, 255, 257
See application file for complete search history.

(56) References Cited

U.S. PATENT DOCUMENTS

2009/0039959 A1\* 2/2009 An ................ H03F 3/45219
330/261

\* cited by examiner

*Primary Examiner* — Andrea Lindgren Baltzell
*Assistant Examiner* — Khiem D Nguyen
(74) *Attorney, Agent, or Firm* — Andrew D. Fortney; Central California IP Group, P.C.

(57) ABSTRACT

Disclosed is an amplifier capable of minimizing shortcircuit current of an output stage of a buffer upon transition of an output voltage while having a high slew rate without increasing power consumption. The amplifier includes an input unit, a conversion unit, an amplification unit, a frequency compensation circuit, and a short-circuit current minimization circuit. Alternatively, the amplifier includes an input unit, a conversion unit, an amplification unit, a frequency compensation circuit, a short-circuit current minimization circuit, and a slew rate improvement circuit.

17 Claims, 5 Drawing Sheets

AMPLIFIER CAPABLE OF MINIMIZING SHORT-CIRCUIT CURRENT OF OUTPUT STAGE WHILE HAVING IMPROVED SLEW RATE

This application claims the benefit of Korean Patent Application No. 10-2021-0028927, filed on Mar. 4, 2021, which is hereby incorporated by reference as if fully set forth herein.

BACKGROUND OF THE INVENTION

Field of the Invention

The present invention relates to an amplifier, and more particularly to an amplifier capable of minimizing short-circuit current of an output stage while having an improved slew rate without increasing power consumption.

Discussion of the Related Art

A liquid crystal display device constituting a display panel includes a plurality of picture elements (pixels) in a matrix including rows and columns, and the operation of each pixel is controlled by a thin film transistor.

Thin film transistors in the same row are commonly connected to each other via a gate line, and thin film transistors in the same column are commonly connected to each other via a data line. Each of the gate line and the data line is controlled, for example, by a display driver IC (DDI).

In order to charge the display panel within a shorter time, it is necessary to improve a slew rate of a buffer to which the DDI is applied. The slew rate is a parameter indicating how fast the output (e.g., of a buffer implemented using an amplifier) follows the corresponding input.

In order to improve the slew rate of the amplifier, it is possible to increase the current in the amplifier, particularly the current consumption in an output stage constituting the amplifier. With rapidly increasing demand for low-power, high-resolution display devices, however, an increase in power consumption in the buffer is undesirable in a portable electronic device using a battery. Therefore, an amplifier or a buffer having an improved slew rate without increasing power consumption is desired.

SUMMARY OF THE INVENTION

Accordingly, the present invention is directed to an amplifier capable of minimizing short-circuit current of an output stage while having an improved slew rate that substantially obviates one or more problems due to limitations and disadvantages of the related art.

It is an object of the present invention to provide an amplifier capable of minimizing short-circuit current of an output stage of a buffer during output voltage or signal transitions, while having a high slew rate without increasing power consumption.

Objects of the present invention devised to solve the problems are not limited to the aforementioned object, and other unmentioned objects will be clearly understood by those skilled in the art based on the following description of the present invention.

To achieve these objects and other advantages and in accordance with the purpose of the invention, as embodied and broadly described herein, an amplifier includes an input unit, a conversion unit, an amplification unit, a frequency compensation circuit, and a short-circuit current minimization circuit. The input unit receives a differential input signal at a first input terminal and a second input terminal. The conversion unit includes a first current mirror including a first current determiner and a first current follower configured to operate in response to a voltage or current on a first current determination and/or voltage generation node of the first current determiner, a second current mirror including a second current determiner and a second current follower configured to operate in response to a voltage or current on a second current determination and/or voltage generation node of the second current determiner, a first transmission gate between the first current determiner and the second current determiner, and a second transmission gate between the first current follower and the second current follower. The conversion unit provides a first conversion voltage and a second conversion voltage that vary in response to the differential input signal at the input unit. The amplification unit provides an output voltage in response to the first conversion voltage and the second conversion voltage. The frequency compensation circuit includes a first compensation capacitor between an output terminal configured to provide the output voltage and the first current follower and a second compensation capacitor between the output terminal and the second current follower. The short-circuit current minimization circuit includes a first short-circuit compensation capacitor between the output terminal and the first current determination and/or voltage generation node and a second short-circuit compensation capacitor between the output terminal and the second current determination and/or voltage generation node.

In another aspect, the amplifier includes an input unit, a conversion unit, an amplification unit, a frequency compensation circuit, a short-circuit current minimization circuit, and a slew rate improvement circuit. The input unit receives a differential input signal at a first input terminal and a second input terminal. The conversion unit includes a first current mirror including a first current determiner and a first current follower configured to operate in response to a voltage or current on a first current determination and/or voltage generation node of the first current determiner, a second current mirror including a second current determiner and a second current follower configured to operate in response to a voltage or current on a second current determination and/or voltage generation node of the second current determiner, a first transmission gate between the first current determiner and the second current determiner, and a second transmission gate between the first current follower and the second current follower. The conversion unit provides a first conversion voltage and a second conversion voltage that vary in response to the differential input signal at the input unit. The amplification unit provides an output voltage in response to the first conversion voltage and the second conversion voltage. The frequency compensation circuit includes a first compensation capacitor between an output terminal configured to provide the output voltage and the first current follower and a second compensation capacitor between the output terminal and the second current follower. The short-circuit current minimization circuit includes a first short-circuit compensation capacitor between the output terminal and the first current determination and/or voltage generation node and a second short-circuit compensation capacitor between the output terminal and the second current determination and/or voltage generation node. The slew rate improvement circuit reversibly connects an output terminal of the amplification unit and an input terminal of the amplification unit in response to a voltage at the first input terminal.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

In order to sufficiently understand the present invention, advantages in operation of the present invention, and objects achieved by implementation of the present invention, the accompanying drawings describing exemplary embodiments of the present invention and the contents stated in the accompanying drawings must be referred to.

Hereinafter, various embodiments of the present invention will be described in detail with reference to the accompanying drawings. The same reference numerals in the respective drawings denote the same members.

Figure 1:
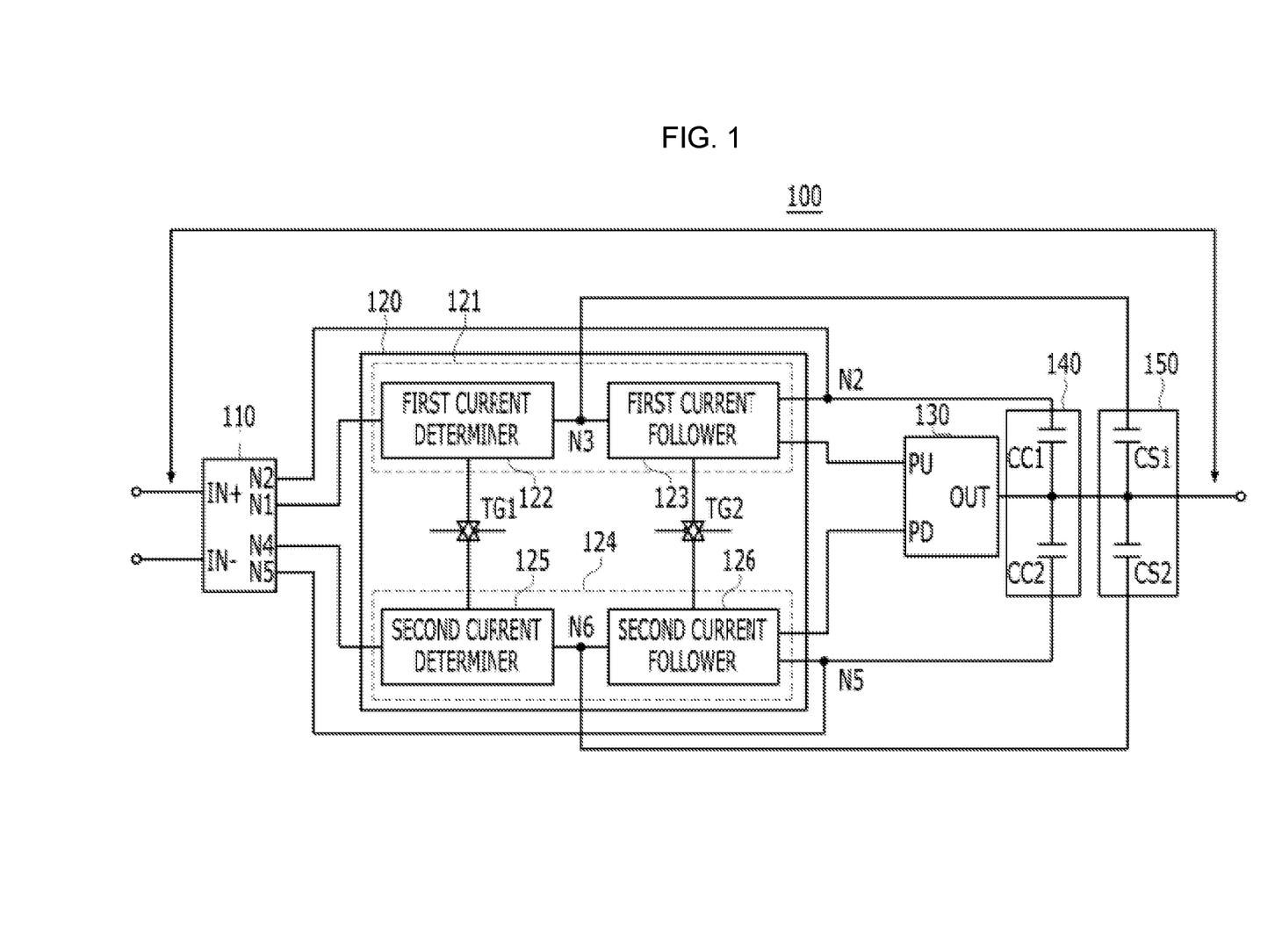
FIG. 1 shows an embodiment of an amplifier according to the present invention.

FIG. 1 shows an embodiment of an amplifier according to the present invention.

Referring to FIG. 1, an amplifier 100 capable of minimizing short-circuit current of an output stage while having an improved slew rate according to the present invention includes an input unit 110, a conversion unit 120, an amplification unit 130, a frequency compensation circuit 140, and a short-circuit current minimization circuit 150.

The input unit 110 receives a differential input signal (e.g., IN− and IN+) at a first input terminal IN+ and a second input terminal IN−.

The conversion unit 120 generates a first conversion voltage PU and a second conversion voltage PD that vary in response to a value of the differential input signal IN−/IN+ input to the input unit 110, and includes a first current mirror 121, a second current mirror 124, a first transmission gate TG1, and a second transmission gate TG2. The first current mirror 121 includes a first current determiner 122 and a first current follower 123. The first current follower 123 operates in response to the voltage or current on a third node N3, which is a current determination and/or voltage generation node, determined by the first current determiner 122. The second current mirror 124 includes a second current determiner 125 and a second current follower 126. The second current follower 126 operates in response to the voltage or current on a sixth node N6, which is a current determination and/or voltage generation node, determined by the second current determiner 125. The first transmission gate TG1 switches between the first current determiner 122 and the second current determiner 125, and the second transmission gate TG2 switches between the first current follower 123 and the second current follower 126.

The amplification unit 130 generates an output voltage OUT in response to the conversion voltages PU and PD output from the conversion unit 120.

The frequency compensation circuit 140 improves frequency characteristics of the output voltage OUT using a first compensation capacitor cc1 between an output terminal OUT configured to provide the output voltage OUT and a second node N2, which is a common node of the input unit 110 and the conversion unit 120, and a second compensation capacitor cc2 between the output terminal OUT configured to provide the output voltage OUT and a fifth node N5, which is a common node of the input unit 110 and the conversion unit 120. Although the term "frequency compensation circuit 140" is used herein for simplicity, the two compensation capacitors cc1 and cc2 also improve a slew rate of the output voltage OUT in addition to improving frequency characteristics of the amplifier 100.

The short-circuit current minimization circuit 150 prevents or minimizes an increase in power consumption of the amplification unit 130 when the voltage at the output voltage OUT transitions. The two compensation capacitors cc1 and cc2 constitute the frequency compensation circuit 140. A third compensation capacitor cs1 is between the output terminal OUT configured to provide the output voltage OUT and the third node N3, which is a current determination and/or voltage generation node, and a fourth compensation capacitor cs2 in between the output terminal OUT and the sixth node N6, which is a second current determination and/or voltage generation node.

The arrow in the upper part of FIG. 1 may mean that the second input terminal IN− and the output terminal OUT may be coupled in a buffer that operates in response to the first input terminal IN+ in FIG. 1. Alternatively, the arrow in the upper part of FIG. 1 may indicate that the differential input signal received at IN+/IN− may be coupled to the output terminal OUT in the present amplifier.

Figure 2:
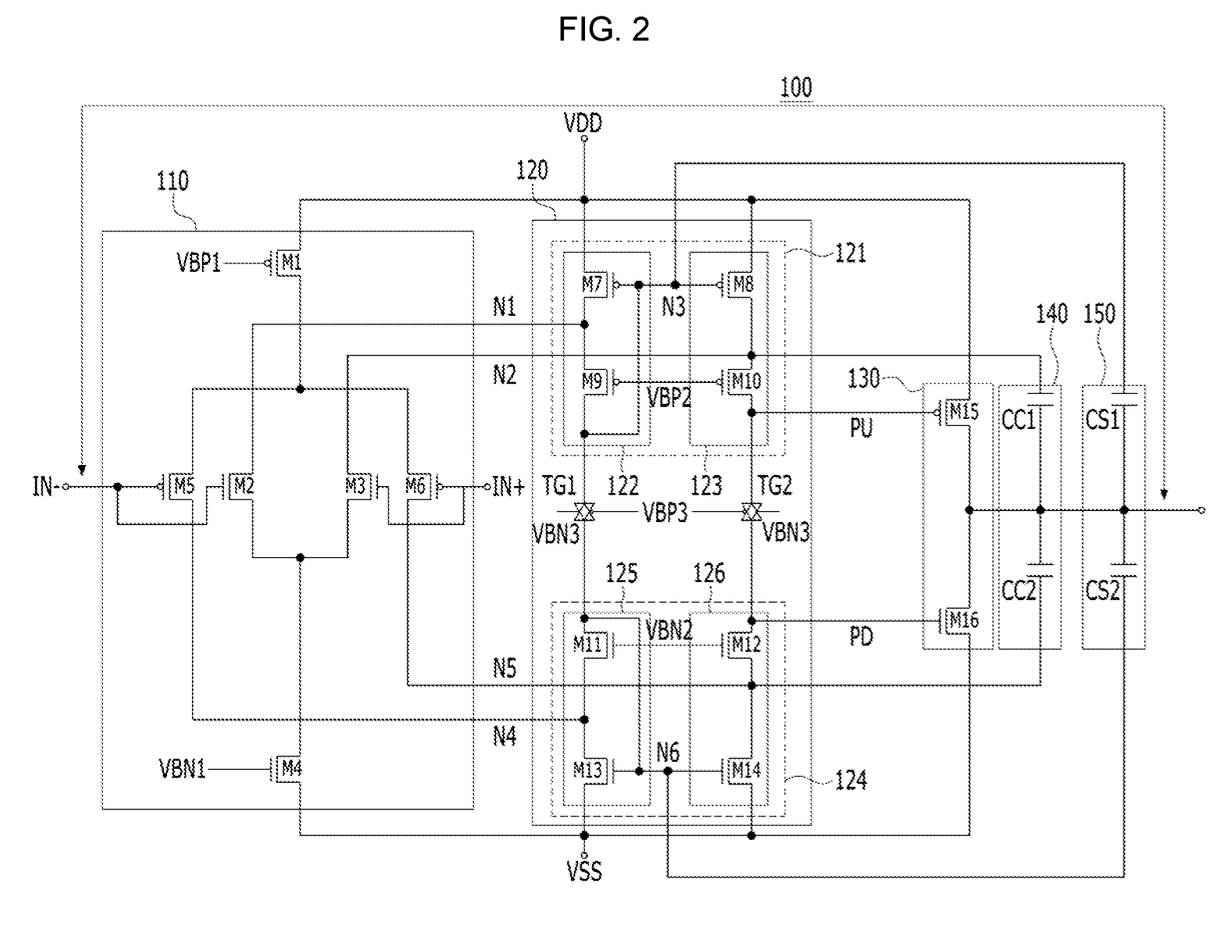
FIG. 2 shows an exemplary circuit of the amplifier shown in FIG. 1.

FIG. 2 shows an exemplary circuit of the amplifier shown in FIG. 1.

Referring to FIG. 2, the amplifier 100 according to the present invention includes an input unit 110, a conversion unit 120, an amplification unit 130, a frequency compensation circuit 140, and a short-circuit current minimization circuit 150.

Transistors shown in FIG. 2 each may comprise a transistor (e.g., a metal oxide silicon (MOS) transistor) including a gate terminal (hereinafter referred to as a gate), a drain terminal (hereinafter referred to as a drain), and a source terminal (hereinafter referred to as a source). In the following description, a P-type transistor and an N-type transistor will not be distinguished from each other, and the drain and the source will be defined and described as one terminal (e.g., a first source/drain terminal) and another terminal (e.g., a second source/drain terminal).

Figure 4:
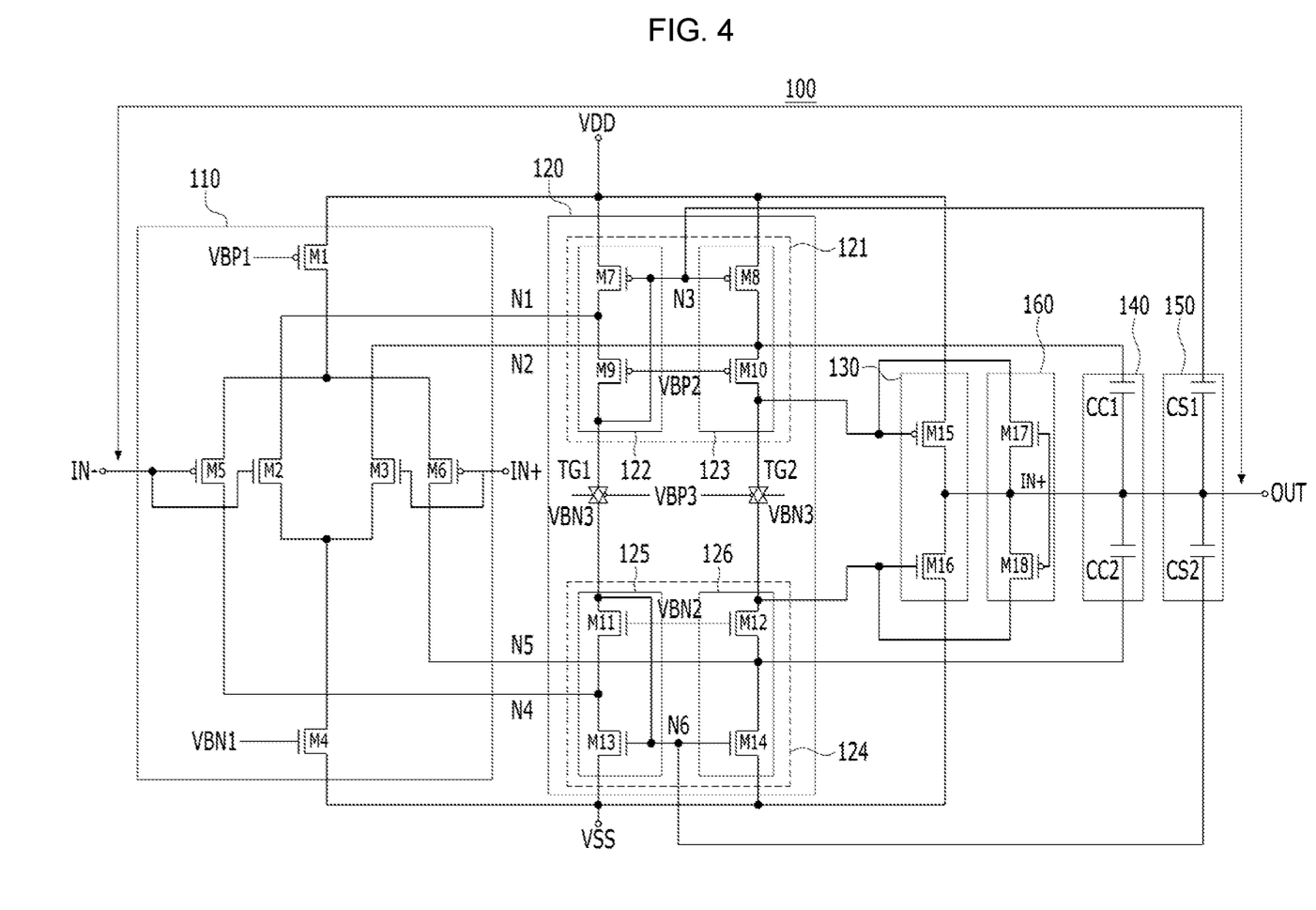
FIG. 4 shows an exemplary circuit of the amplifier shown in FIG. 3.

In an example shown in each of FIG. 2 and FIG. 4, a description of which will follow, the circuit includes both P-type transistors and N-type transistors. If the circuit shown in each of FIGS. 2 and 4 is used, however, conversion into a circuit using one kind of transistors, such as P-type transistors or N-type transistors, or conversion into a circuit using bipolar transistors may be easily performed, a detailed description of which will be omitted.

The input unit 110 may comprise 6 transistors M1 to M6.

One terminal of the first transistor M1 is connected to a first supply voltage VDD, and a first bias voltage VBP1 is applied to a gate of the first transistor M1. One terminal of the fifth transistor M5 is connected to another terminal of the first transistor M1, another terminal of the fifth transistor M5 is connected to a fourth node N4, and a second input terminal IN− is connected to a gate of the fifth transistor M5. One terminal of the sixth transistor M6 is connected to another terminal of the first transistor M1, another terminal of the sixth transistor M6 is connected to a fifth node N5, and a first input terminal IN+ is connected to a gate of the sixth transistor M6. One terminal of the fourth transistor M4 is connected to a second supply voltage VSS, and a second bias voltage VBN1 is applied to a gate of the fourth transistor M4. One terminal of the second transistor M2 is connected to a first node N1, the second input terminal IN− is connected to a gate of the second transistor M2, and another terminal of the second transistor M2 is connected to another terminal of the fourth transistor M4. One terminal of the third transistor M3 is connected to a second node N2, the first input terminal IN+ is connected to a gate of the third transistor M3, and another terminal of the third transistor M3 is connected to another terminal of the fourth transistor M4.

The first supply voltage VDD is higher than the second supply voltage VSS. The first transistor M1 and the fourth transistor M4 are also called a current source, since the first transistor M1 and the fourth transistor M4 determine the amplitude of the current that flows in the input unit 110 in response to the two bias voltages VBP1 and VBN1. Here, the two bias voltages are DC voltages.

The conversion unit 120 comprises a first current mirror 121, a second current mirror 124, a first transmission gate TG1, and a second transmission gate TG2.

The first current mirror 121 comprises four transistors M7 to M10.

One terminal of the seventh transistor M7 is connected to the first supply voltage VDD, and another terminal of the seventh transistor M7 is connected to the first node N1. One terminal of the eighth transistor M8 is connected to the first supply voltage VDD, and another terminal of the eighth transistor M8 is connected to the second node N2. One terminal of the ninth transistor M9 is connected to the first node N1, another terminal of the ninth transistor M9 is connected to the third node N3, and a gate of the ninth transistor M9 receives a third bias voltage VBP2. The third node N3 is also connected to gates of the seventh transistor M7 and the eighth transistor M8. One terminal of the tenth transistor M10 is connected to the second node N2, another terminal of the ninth transistor M9 is connected to a pull-up terminal PU, and a gate of the tenth transistor M10 receives the third bias voltage VBP2. Since the third node N3 is commonly connected to the gates of the seventh transistor M7 and the eighth transistor M8, current that flows from the first supply voltage VDD to the seventh transistor M7 and the eighth transistor M8 may be determined by the voltage and/or current on the third node N3. For this reason, the third node is called a current determination and/or voltage generation node.

The second current mirror 124 may comprise four transistors M11 to M14. One terminal of the eleventh transistor M11 is connected to the sixth node N6, another terminal of the eleventh transistor M11 is connected to the fourth node N4, and a gate of the eleventh transistor M11 receives a fourth bias voltage VBN2. One terminal of the twelfth transistor M12 is connected to a pull-down (PD) terminal PD, another terminal of the twelfth transistor M12 is connected to the fifth node N5, and a gate of the twelfth transistor M12 receives the fourth bias voltage VBN2. One terminal of the thirteenth transistor M13 is connected to the fourth node N4, another terminal of the thirteenth transistor M13 receives the second supply voltage VSS, and a gate of the thirteenth transistor M13 is connected to the sixth node N6. One terminal of the fourteenth transistor M14 is connected to the fifth node N5, another terminal of the fourteenth transistor M14 receives the second supply voltage VSS, and a gate of the fourteenth transistor M14 is connected to the sixth node N6. For the same reason as in the first current mirror 121, the sixth node N6 is also called a current determination and/or voltage generation node.

The first transmission gate TG1 switches between the third node N3 and the sixth node N6 in response to a fifth bias voltage VBP3 and a sixth bias voltage VBN3. The second transmission gate TG2 switches between the pull-up (PU) node PU and the pull-down node PD in response to the fifth bias voltage VBP3 and the sixth bias voltage VBN3. A transmission gate is configured to have a structure in which two terminals of a P-type transistor and an N-type transistor are coupled to each other, and therefore the fifth bias voltage VBP3 is received by a gate of the P-type transistor, while the sixth bias voltage VBN3 is received by a gate of the N-type transistor.

When the second transmission gate TG2 is short-circuited (turned on), the pull-up node PU and the pull-down node PD are connected to each other, and a predetermined magnitude of resistance may arise between the pull-up node PU and the pull-down node PD in series as a result of a switching resistance of the second transmission gate TG2. When the second transmission gate TG2 is turned on, a difference in voltages on the pull-up node PU and the pull-down node PD may exist.

Hereinafter, operation of the input unit 110 and the conversion unit 120 will be described.

Referring to FIG. 2, the current supplied from the first transistor M1 in the input unit 110 flows through the fifth transistor M5 and the sixth transistor M6 to the thirteenth transistor M13 and the fourteenth transistor M14 in the conversion unit 120 via. Current that flows through the seventh transistor M7 and the eighth transistor M8 in the conversion unit 120 flows through the second transistor M2 and the third transistor M3 to the fourth transistor M4. For this reason, the first transistor M1 is called a current source, and the fourth transistor M4 is called a current sink.

In a functional aspect, the conversion unit 120 may be divided into a first current mirror 121 coupled to the second transistor M2 and the third transistor M3 in the input unit 110 to generate a first conversion voltage PU and a second current mirror 124 coupled to the fifth transistor M5 and the sixth transistor M6 in the input unit 110 to generate a second conversion voltage PD. The first current mirror 121 may comprise the seventh transistor M7 to the tenth transistor M10, and the second current mirror 124 may comprise the eleventh transistor M11 to the fourteenth transistor M14.

In the first current mirror 121, the gates of the seventh transistor M7 and the eighth transistor M8 are commonly connected to the third node N3, and therefore same current flows in the first node N1 and the second node N2 if the seventh transistor M7 and the eighth transistor M8 are equal to each other in size (i.e., they have an identical ratio of the gate length to the gate width), and no other external factors act.

In the second current mirror 124, the ninth transistor M9 and the seventh transistor M7 are in series, the tenth transistor M10 and the eighth transistor M8 are in series, another terminal of the ninth transistor M9 is the third node N3, and another terminal of the tenth transistor M10 is the pull-up terminal PU, and therefore the current that flows in the first node N1 and the second node N2 flows to the ninth transistor M9 and the tenth transistor M10 if no other external factors act.

Referring to FIG. 2, the first node N1 and the second node N2 are connected respectively to one terminal of the second transistor M2 and one terminal of the third transistor M3 in the second input terminal IN− and the first input terminal IN+, respectively, in the input unit 110. When the same voltage is applied to the gates of the second transistor M2 and the third transistor M3, generally the same amount of current is introduced into one terminal of the second transistor M2 and one terminal of the third transistor M3 through the first node N1 and the second node N2.

When a difference arises between the voltages applied to the gates of the second transistor M2 and the third transistor M3, the amount of current received by the second transistor M2 and the third transistor M3 differs in proportion to the difference between the input voltages (i.e., applied to the gates of M2 and M3), whereby a difference in voltage levels on the first node N1 and the second node N2 arises.

If the voltage applied to the gate of the third transistor M3 corresponding to the first input terminal IN+ is higher than the voltage applied to the gate of the second transistor M2 corresponding to the second input terminal IN−, the amount of current that flows through the third transistor M3 must be greater than the amount of current that flows through the second transistor M2. That is, the amount of current through the second transistor M2 from the first node N1 may become less than the amount of current through the third transistor M3 from the second node N2, and the voltage on the third node N3 applied to the gates of the seventh transistor M7 and the eighth transistor M8 increases. Therefore, the voltage on the second node N2 may decrease (e.g., in order to increase the amount of current that flows to the second node N2 via the eighth transistor M8), and the voltage at another terminal of the tenth transistor M10, i.e. the pull-up terminal PU, may also decrease. That is, it can be seen that, when there occurs a difference between the voltage applied to the first input terminal IN+ and the voltage applied to the second input terminal IN1, the voltage on the third node N3 and the voltage on the second node N2 fluctuate in opposite directions.

The second current mirror 124 may be expressed as a current mirror implemented using four transistors M11 to M14, and the operation of the second current mirror 124 is performed in the same manner as the operation of the first current mirror 121.

The seventh transistor M7, the eighth transistor M8, and the ninth transistor M9, which constitute a current mirror, perform a function of equalizing current that flows in the first node N1 and current that flows in the second node N2.

In the same manner, the eleventh transistor M11, the thirteenth transistor M13, and the fourteenth transistor M14, which also constitute a current mirror circuit, perform a function of equalizing current that flows in the fourth node N4 and current that flows in the fifth node N5.

The voltage levels of the pull-up terminal PU and the pull-down terminal PD may change in response to a difference between the voltage OUT applied to the gates of the second transistor M2 and the fifth transistor M5 in the input unit 110 and the voltage IN+ applied to the third transistor M3 and the sixth transistor M6. For this reason, voltages provided at the pull-up terminal PU and the pull-down terminal PD are called conversion voltages, and a circuit implemented by eight transistors M7 to M14 and two transmission gates is called a conversion unit 120.

In FIG. 2, the seventh transistor M7 to the tenth transistor M10 are shown as P-type transistors, and the eleventh transistor M11 to the fourteenth transistor M14 are shown as N-type transistors.

The bias voltages VBP1, VBN1, VBP2, VBN2, VBP3, VBN3 used in the input unit 110 and the conversion unit 120 are voltages having fixed voltage levels that are generated outside the circuit shown in FIG. 2 and applied, which is equally applied to the following description of FIG. 4.

The amplification unit 130 may comprise two transistors M15 and M16 configured to provide an output voltage OUT in response to the first conversion voltage PU of the pull-up terminal PU and the second conversion voltage PD of the pull-down terminal PD.

One terminal of the fifteenth transistor M15 is connected to the first supply voltage VDD, and a gate of the fifteenth transistor M15 is connected to the pull-up terminal PU. One terminal of the sixteenth transistor M16 is connected to another terminal of the fifteenth transistor M15, another terminal of the sixteenth transistor M16 is connected to the second supply voltage VSS, and a gate of the sixteenth transistor M16 is connected to the pull-down terminal PD. A voltage output from a common terminal (hereinafter referred to as an output terminal) of the two transistors M15 and M16 becomes an output voltage OUT.

In FIG. 2, the fifteenth transistor M15 comprises a P-type transistor, and the sixteenth transistor M16 comprises an N-type transistor.

The frequency compensation circuit 140 may comprise a first compensation capacitor cc1 having two terminals connected to the second node N2 and the output terminal OUT and a second compensation capacitor cc2 having two terminals connected to the fifth node N5 and the output terminal OUT.

The short-circuit current minimization circuit 150 may comprise a first short-circuit compensation capacitor cs1 having two terminals connected to the third node N3 and the output terminal OUT and a second short-circuit compensation capacitor cs2 having two terminals connected to the sixth node N6 and the output terminal OUT.

Hereinafter, the overall operation of the amplifier shown in FIG. 2 will be described.

Since electrical characteristics and operations of elements in the input unit 110, the conversion unit 120, and the amplification unit 130 are known by those skilled in the art, a description will be given based on operations of the frequency compensation circuit 140 and the short-circuit current minimization circuit 150, which are the core idea of the present invention. In the following description, the name of a specific node or terminal and the voltage on the node will be commonly used in order to simplify reference symbols and for convenience of description. For example, when the reference symbol of an output terminal is "OUT," the voltage at the output terminal will be denoted by the label "OUT."

When the output terminal OUT is not connected to the second input terminal IN− (i.e. is in an open loop state), the voltage at the output terminal OUT is either the first supply voltage VDD or the second supply voltage VSS due to a difference in voltage between the two input terminals IN− and IN+(in a period of time other than an output voltage transition period).

When the output terminal OUT is connected to the second input terminal IN−, the amplifier of FIG. 2 may function as a buffer, and the voltage at the output terminal OUT follows the voltage at the first input terminal IN+. The following description is based the amplifier shown in FIG. 2 operating as a buffer.

In order for the voltage at the output terminal OUT having the second supply voltage VSS to increase to the first supply voltage VDD, the voltage applied to the first input terminal IN+ must be higher than the current voltage at the output terminal OUT. As a result, the first conversion voltage PU decreases, and a difference in voltage between the first conversion voltage PU and the first supply voltage VDD increases.

When the voltage at the output terminal OUT is equal to the second supply voltage VSS, the sixteenth transistor M16 is on, while the fifteenth transistor M15 is off. For the voltage at the output terminal OUT to increase (e.g., from VSS), the fifteenth transistor M15 must be turned on, and the amount of current that flows from the fifteenth transistor M15 to the output terminal OUT must increase. At the same time, the amount of current that flows from the output terminal OUT to the second supply voltage VSS via the sixteenth transistor M16 must decrease.

When the fifteenth transistor M15 is turned on and the current supplied to the output terminal OUT increases, it means that a difference between the first conversion voltage PU supplied to the gate of the fifteenth transistor M15 and the first supply voltage VDD must increase. For example, on the assumption that the first supply voltage VDD is 5V, the first conversion voltage PU must decrease from 4.3V to 4.2V or 4.1V so that the difference in voltage between the two terminals VDD and PU increases. Here, although the first conversion voltage PU is described as decreasing, the present amplifier 100 is designed so that the first conversion voltage PU instantly decreases in order to improve the slew rate of the amplifier 100.

Referring to FIG. 2, when the voltage at the output terminal OUT increases from a low level to a high level (rising edge), the voltage on the third node N3 increases, whereby the voltage at the pull-up terminal PU decreases, and therefore Vgs (a difference in voltage between the gate and the source) of the fifteenth transistor M15 increases.

The first conversion voltage PU is relevant or related to the voltage on the third node N3. When the voltage on the third node N3 increases, it may mean that the Vgs of the eighth transistor M8 decreases, which may also mean that the amount of current that flows between the first supply voltage VDD and the eighth transistor M8 decreases. In order to increase the amount of current that flows through the eighth transistor M8, therefore, the Vds (a difference in voltage between the drain and the source) of the eighth transistor M8 must increase. Consequently, when the voltage on the third node N3 increases, it may mean that the first conversion voltage PU must decrease.

The operation of the circuit will be described again.

When the voltage at the output terminal OUT increases from a low level to a high level, the voltage on the second node N2 decreases in the circuit shown in FIG. 2, as previously described. As the voltage on the second node N2 decreases, the first conversion voltage PU may also decrease, and therefore the amount of current that flows through the fifteenth transistor M15 (controlled by the first conversion voltage PU) may also increase.

Meanwhile, when the voltage at the output terminal OUT increases from a low level to a high level, the voltage on the fourth node N4 may also decrease. When the voltage on the fourth node N4 decreases, the second conversion voltage PD also decreases, and therefore the amount of current that flows through the sixteenth transistor M16 (controlled by the second conversion voltage PD) decreases.

When the amount of current that flows through the fifteenth transistor M15 increases, and the amount of current that flows through the sixteenth transistor M16 decreases, the voltage at the output terminal OUT generally increases.

In order for the voltage at the output terminal OUT to transition from the second supply voltage VSS to the first supply voltage VDD, the fifteenth transistor M15 and the sixteenth transistor M16 may be simultaneously turned on. However, the two transistors M15 and M16 may be simultaneously turned on during part of the transition period of the voltage at the output terminal OUT, not the entire transition period. As will be described below, the period during which the two compensation capacitors cc1 and cc2 are short-circuited is the entire transition period of the voltage at the output terminal OUT. If the time during which the fifteenth transistor M15 and the sixteenth transistor M16 are simultaneously turned on increases due to a short circuit of the two compensation capacitors cc1 and cc2, power consumption in the amplifier 100 further increases, and it is preferable to decrease or remove this.

The two compensation capacitors cc1 and cc2, which may improve a slew rate and frequency characteristics of the amplifier 100, may increase the amount of current that flows through the two transistors M15 and M16 in the amplification unit 130 during the entire period during which the voltage at the output terminal OUT transitions.

For an amplifier 100 having a high slew rate, the level of the first conversion voltage PU rapidly decreases from the rising edge of the voltage of the output terminal OUT. When the level of the first conversion voltage PU rapidly decreases, the first compensation capacitor cc1 is instantaneously short-circuited, and therefore the voltage on the second node N2 is affected by the voltage at the output terminal OUT.

In the same manner, for an amplifier 100 having a high slew rate, the level of the second conversion voltage PD rapidly decreases from the rising edge of the voltage of the output terminal OUT. When the level of the second conversion voltage PD rapidly decreases, the second compensation capacitor cc2 is instantaneously short-circuited, and therefore the voltage on the fifth node N5 is affected by the voltage at the output terminal OUT.

As described above, the compensation capacitors cc1 and cc2 are short-circuited during the entire transition period of the voltage at the output terminal OUT, not a portion of the transition period. In the entire transition period, the first conversion voltage PU decreases, and the second conversion voltage PD increases. As a result, the amount of current that flows through the fifteenth transistor M15 and the sixteenth transistor M16 may increase, in which case power consumption in the amplifier 100 increases.

The short-circuit current minimization circuit 150 minimizes the increase in time during which the fifteenth transistor M15 and the sixteenth transistor M16 are simultaneously turned on due to the short circuit of the two compensation capacitors cc1 and cc2. Here, "short-circuit current" means a current that flows between the two transistors M15 and M16 as the result of the two transistors M15 and M16 being simultaneously turned on when the compensation capacitors cc1 and cc2 are short-circuited.

The two compensation capacitors cc1 and cc2 connect the output terminal OUT to the second node N2 and the fifth node N5, respectively, and the two short-circuit compensation capacitors cs1 and cs2 in the short-circuit current minimization circuit 150 connect the output terminal OUT to the third node N3 and the sixth node N6, respectively.

Since the output terminal OUT is commonly connected to the third node N3 and the second node N2 by the two compensation capacitors cc1 and cc2, a fluctuation in voltage at the output terminal OUT may simultaneously affect the third node N3 and the second node N2. The increase and decrease directions of the voltage on the third node N3 are opposite from the increase and decrease directions of the voltage on the second node N2 (i.e., as the voltage on the third node N3 increases, the voltage on the second node N2 decreases, and vice versa), as previously described. Consequently, it can be easily predicted that the voltage at the pull-up terminal PU decreased by the first compensation capacitor cc1 may be offset or decreased by a component (or voltage) increased by the first short-circuit compensation capacitor cs1.

The above description of operational characteristics when the voltage at the output terminal OUT increases from a low level to a high level is equally applied to operational characteristics when the voltage at the output terminal OUT decreases from a high level to a low level (falling edge) in FIG. 2.

Figure 3:
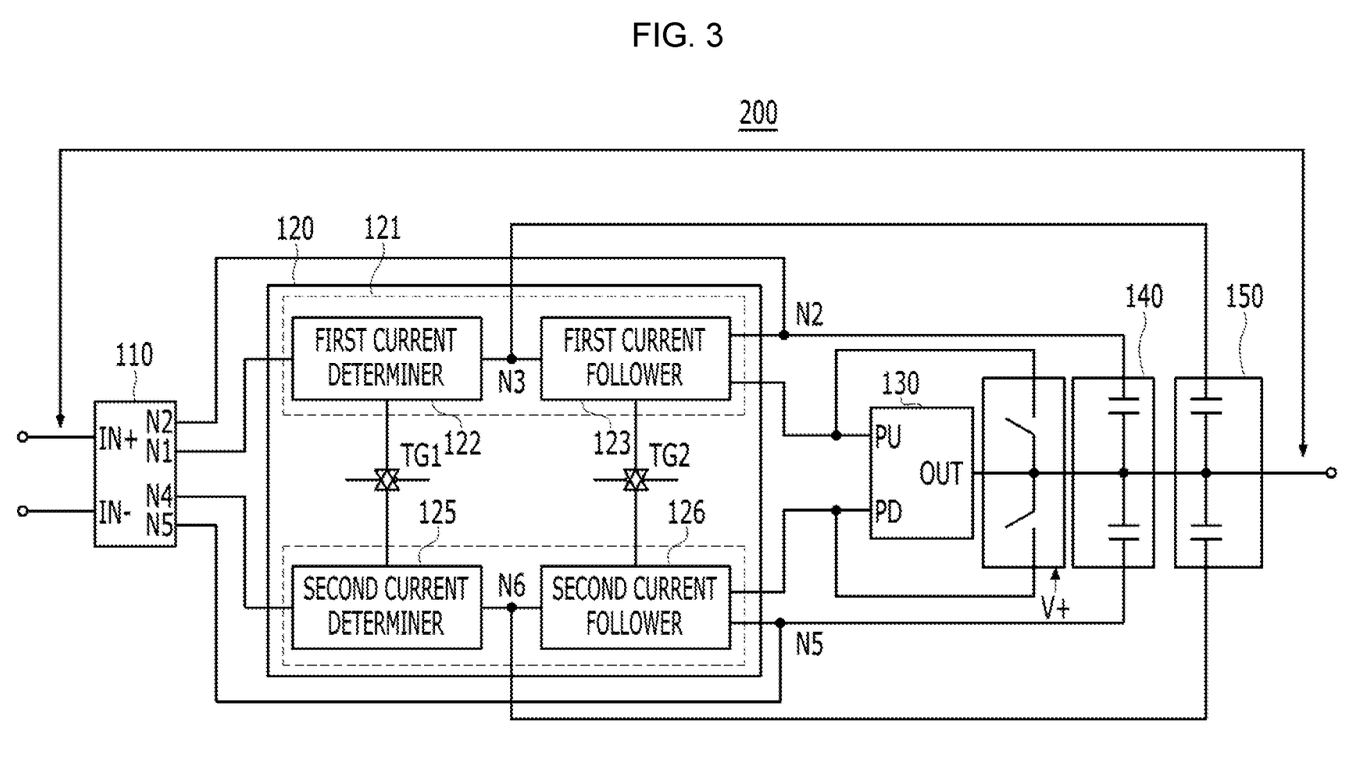
FIG. 3 shows another embodiment of the amplifier according to the present invention.

FIG. 3 shows another embodiment of the amplifier according to the present invention.

Referring to FIG. 3, the amplifier 200 according to the present invention includes an input unit 110, a conversion unit 120, an amplification unit 130, a frequency compensation circuit 140, a short-circuit current minimization circuit 150, and a slew rate improvement circuit 160.

The input unit 110, the conversion unit 120, the amplification unit 130, the frequency compensation circuit 140, and the short-circuit current minimization circuit 150 are identical to the circuit shown in FIG. 2, and therefore a description thereof will be omitted.

The slew rate improvement circuit 160 improves a slew rate of the output voltage of the amplification unit 130 in response to the first input voltage IN+ applied to the first input terminal IN+.

The arrow in the upper part of FIG. 3 may mean that the second input terminal IN− and the output terminal OUT may be coupled to each other in a buffer.

FIG. 4 shows an exemplary circuit of the amplifier shown in FIG. 3.

Referring to FIG. 4, the amplifier 200 according to the present invention includes an input unit 110, a conversion unit 120, an amplification unit 130, a frequency compensation circuit 140, a short-circuit current minimization circuit 150, and a slew rate improvement circuit 160.

Since the input unit 110, the conversion unit 120, the amplification unit 130, the frequency compensation circuit 140, and the short-circuit current minimization circuit 150 are identical in construction to the circuit shown in FIG. 2, as described above, only the construction of the slew rate improvement circuit 160 will be described.

The slew rate improvement circuit 160 may comprise two transistors M17 and M18 configured respectively to reversibly connect the output terminal OUT to the pull-up terminal PU and the pull-down terminal PD in response to the first input voltage IN+.

One terminal of the seventeenth transistor M17 is connected to the pull-up terminal PU, another terminal of the seventeenth transistor M17 is connected to the output terminal OUT, and the first input voltage IN+ is applied to a gate of the seventeenth transistor M17. One terminal of the eighteenth transistor M18 is connected to the pull-down terminal PD, another terminal of the eighteenth transistor M18 is connected to the output terminal OUT, and the first input voltage IN+ is applied to a gate of the eighteenth transistor M18.

Referring to FIG. 4, both transistors M17 and M18 in the slew rate improvement circuit 160 operate in response to the first input voltage IN+.

When a difference between the first input voltage IN+ and the voltage at the output terminal OUT is equal to or greater than the respective threshold voltages Vth of the two transistors M17 and M18, the transistors M17 and M18 are turned on to connect the output terminal OUT to the pull-up terminal PU and the pull-down terminal PD, respectively, thereby improving the slew rate of the output signal at the output terminal OUT.

After a slew rate improvement process is performed during the period in which the difference between the first input voltage IN+ and the voltage of the output terminal OUT is equal to or greater than the threshold voltages Vth of the two transistors M17 and M18, the two transistors M17 and M18 are turned off when the difference between the first input voltage IN+ and the voltage at the output terminal OUT is less than the threshold voltages Vth of the two transistors M17 and M18.

Figure 5:
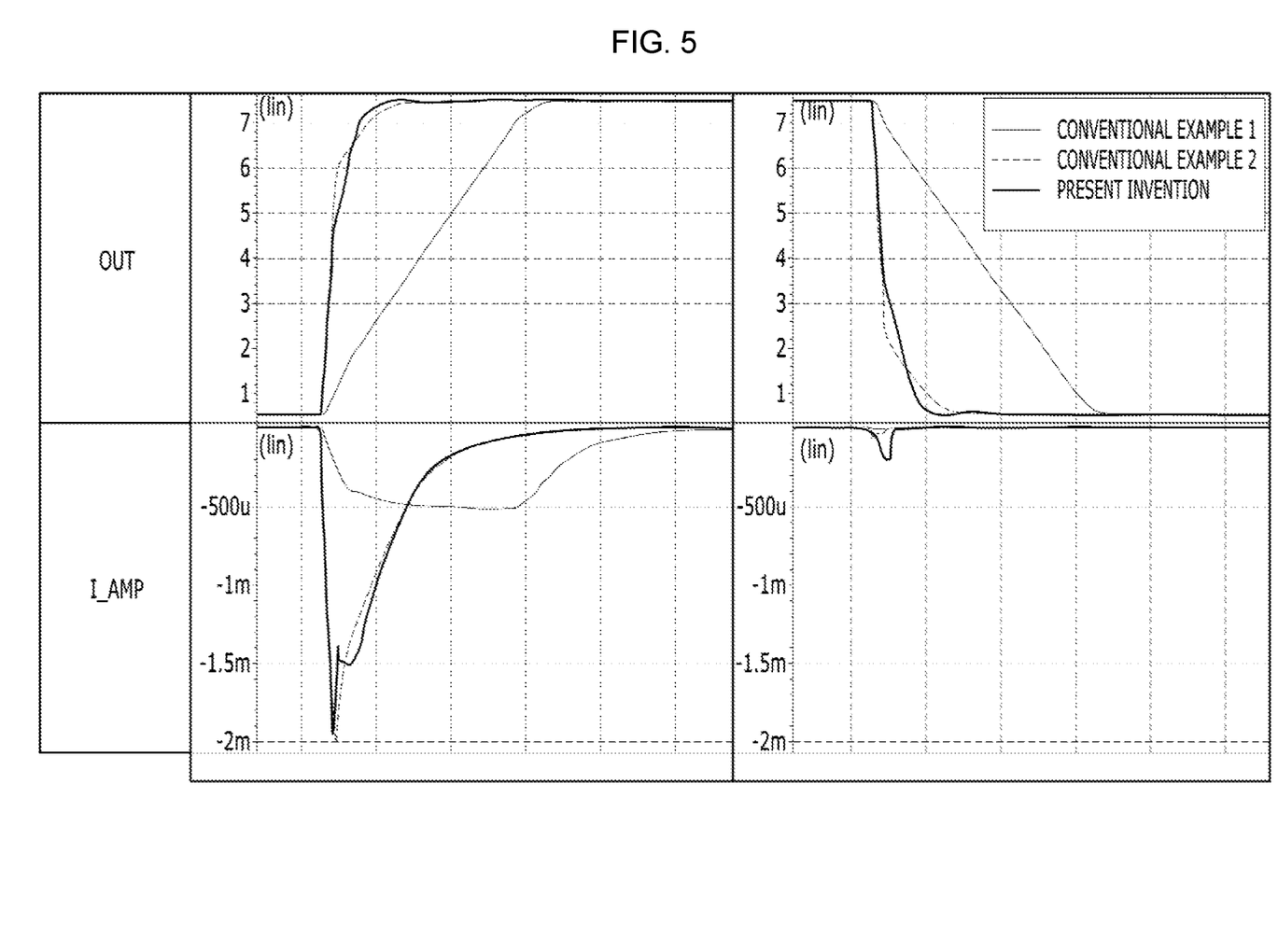
FIG. 5 is a graph showing a comparison in electrical properties between conventional buffers and a buffer according to the present invention.

FIG. 5 shows a comparison in electrical properties between conventional buffers and a buffer according to the present invention.

In FIG. 5, conventional example 1 is an example of a circuit in which no special measures have been taken to improve the slew rate, and conventional example 2 is an example of a circuit in which special measures have been taken to improve the slew rate. Although not shown, the circuit of conventional example 2 has a switch configured to connect one terminal of the compensation capacitor cc1 and one terminal of the compensation capacitor cc2 shown in FIGS. 2 and 4 to two different nodes, and therefore the circuit is more complicated and has higher power consumption than in the present invention.

Referring to FIG. 5, it can be seen that electrical characteristics OUT (which may be the slew rate, or voltage as a function of time during a signal transition) in a later stage of the rising and falling transitions of the output signal from the present amplifier are improved, compared to conventional example 2.

The amplitude of the current I_AMP that flows in the amplification unit 130 in the present invention is remarkably higher than that in conventional example 1 and is similar to that in conventional example 2. Referring to FIG. 5, the current in the amplification unit 130 in the present invention is similar to that in conventional example 2, whereas the overall power consumption of the buffer in the present invention is lower than that in conventional example 2, which is not shown in FIG. 5.

As previously described, the amplifier shown in FIGS. 1 to 4 may be used as a buffer when the output terminal OUT and the second input terminal IN− are coupled to each other. The amplifier according to the present invention may be used in a source driver circuit of a liquid crystal display device as a buffer. The source driver circuit of the liquid crystal display device includes a latch circuit configured to store data and a level shifter configured to change the voltage of the data (e.g., output from the latch circuit). The source driver circuit converts a digital value of the level shifted data into an analog signal, and supplies the analog signal to a data line using the buffer.

As is apparent from the above description, an amplifier according to the present invention has advantages in that it is possible to improve a slew rate without increasing power consumption, while using a small or minimum number of elements, and that it is possible to minimize a short circuit of two transistors in an amplification unit, the two transistors being in series between a first supply voltage and a second supply voltage.

It should be noted that the effects of the present invention are not limited to the effects mentioned above, and other unmentioned effects will be clearly understood by those skilled in the art from the above description.

While the technical idea of the present invention has been described with reference to the accompanying drawings, this illustratively describes preferred embodiments of the present invention, not restricts the present invention. In addition, a person having ordinary skill in the art to which the present invention pertains will appreciate that various modifications and alterations are possible without departing from the category of the technical idea of the present invention.

What is claimed is:

1. An amplifier comprising:
    an input unit configured to receive a differential input signal at a first input terminal and a second input terminal;
    a conversion unit comprising a first current mirror comprising a first current determiner and a first current follower configured to operate in response to a voltage or current on a first current determination and/or voltage generation node of the first current determiner, a second current mirror comprising a second current determiner and a second current follower configured to operate in response to a voltage or current on a second current determination and/or voltage generation node of the second current determiner, a first transmission gate disposed between the first current determiner and the second current determiner, and a second transmission gate between the first current follower and the second current follower, the conversion unit being configured to provide a first conversion voltage and a second conversion voltage that vary in response to the differential input signal at the input unit;
    an amplification unit configured to provide an output voltage in response to the first conversion voltage and the second conversion voltage;
    a frequency compensation circuit comprising a first compensation capacitor disposed between an output terminal and the first current follower and a second compensation capacitor disposed between the output terminal and the second current follower; and
    a short-circuit current minimization circuit comprising a first short-circuit compensation capacitor disposed between the output terminal and the first current determination and/or voltage generation node and a second short-circuit compensation capacitor disposed between the output terminal and the second current determination and/or voltage generation node.

2. The amplifier according to claim 1, wherein
    an amplitude of the voltage on the first current determination and/or voltage generation node and an amplitude of the voltage on a node of the first current follower to which one terminal of the first compensation capacitor is connected change in opposite directions upon a transition of the output voltage, and
    an amplitude of the voltage on the second current determination and/or voltage generation node and an amplitude of the voltage on a node of the second current follower to which one terminal of the second compensation capacitor is connected change in opposite directions upon the transition of the output voltage.

3. The amplifier according to claim 2, wherein
    a voltage on the first current determination and/or voltage generation node decreases while a voltage on the node of the first current follower increases during a rising transition of the output voltage, and the voltage on the first current determination and/or voltage generation node increases while the voltage on the node of the first current follower decreases during a falling transition of the output voltage.

4. The amplifier according to claim 2, wherein
    a voltage on the second current determination and/or voltage generation node decreases while a voltage on the node of the second current follower increases during a rising transition of the output voltage, and
    the voltage on the second current determination and/or voltage generation node increases while the voltage on the node of the second current follower decreases in a falling transition of the output voltage.

5. The amplifier according to claim 1, wherein
    the first current determiner comprises:
        a seventh transistor having one terminal connected to a first supply voltage; and
        a ninth transistor having one terminal connected to another terminal of the seventh transistor, a gate configured to receive a third bias voltage, and another terminal connected to a gate of the seventh transistor and one terminal of the first transmission gate, wherein the other terminal of the ninth transistor is the first current determination and/or voltage generation node, and
    the first current follower comprises:
        an eighth transistor having one terminal connected to the first supply voltage, another terminal connected to one terminal of the first compensation capacitor, and a gate connected to the first current determination and/or voltage generation node; and
        a tenth transistor having one terminal connected to the other terminal of the eighth transistor, a gate configured to receive the third bias voltage, and another terminal configured to provide the first conversion voltage and connected to one terminal of the second transmission gate.

6. The amplifier according to claim 1, wherein
    the second current determiner comprises:
        an eleventh transistor having one terminal connected to another terminal of the first transmission gate and a gate configured to receive a fourth bias voltage, wherein the one terminal of the eleventh transistor is the second current determination and/or voltage generation node; and
        a thirteenth transistor having one terminal connected to another terminal of the eleventh transistor, another terminal connected to a second supply voltage, and a gate connected to the second current determination and/or voltage generation node, and
    the second current follower comprises:
        a twelfth transistor having one terminal configured to provide the second conversion voltage and connected to another terminal of the second transmission gate, and a gate configured to receive the fourth bias voltage; and
        a fourteenth transistor having one terminal connected to another terminal of the twelfth transistor, a gate connected to the second current determination and/or voltage generation node, and another terminal connected to the second supply voltage.

7. The amplifier according to claim 1, wherein
    each of the first current determiner and the first current follower comprises a P-type transistor, and
    each of the second current determiner and the second current follower comprises an N-type transistor.

8. A source driver circuit comprising a buffer connecting the output terminal of the amplifier according to claim 1 to the second input terminal.

9. An amplifier comprising:
   an input unit configured to receive a differential input signal at a first input terminal and a second input terminal;
   a conversion unit comprising a first current mirror comprising a first current determiner and a first current follower configured to operate in response to a voltage or current on a first current determination and/or voltage generation node of the first current determiner, a second current mirror comprising a second current determiner and a second current follower configured to operate in response to a voltage or current on a second current determination and/or voltage generation node of the second current determiner, a first transmission gate disposed between the first current determiner and the second current determiner, and a second transmission gate between the first current follower and the second current follower, the conversion unit being configured to provide a first conversion voltage and a second conversion voltage that vary in response to the differential input signal at the input unit;
   an amplification unit configured to provide an output voltage in response to the first conversion voltage and the second conversion voltage;
   a frequency compensation circuit comprising a first compensation capacitor disposed between an output terminal and the first current follower and a second compensation capacitor disposed between the output terminal and the second current follower;
   a short-circuit current minimization circuit comprising a first short-circuit compensation capacitor disposed between the output terminal and the first current determination and/or voltage generation node and a second short-circuit compensation capacitor disposed between the output terminal and the second current determination and/or voltage generation node; and
   a slew rate improvement circuit configured to reversibly connect an output terminal of the amplification unit and an input terminal of the amplification unit in response to a voltage at the first input terminal.

10. The amplifier according to claim 8, wherein
    an amplitude of the voltage on the first current determination and/or voltage generation node and an amplitude of the voltage on a node of the first current follower to which one terminal of the first compensation capacitor is connected change in opposite directions upon a transition of the output voltage, and
    an amplitude of the voltage on the second current determination and/or voltage generation node and an amplitude of the voltage on a node of the second current follower to which one terminal of the second compensation capacitor is connected change in opposite directions upon the transition of the output voltage.

11. The amplifier according to claim 9, wherein
    a voltage on the first current determination and/or voltage generation node decreases while a voltage on the node of the first current follower increases during a rising transition of the output voltage, and
    the voltage on the first current determination and/or voltage generation node increases while the voltage on the node of the first current follower decreases during a falling transition of the output voltage.

12. The amplifier according to claim 9, wherein
    a voltage level of the second current determination and/or voltage generation node decreases while a voltage level of the node of the second current follower increases during a rising transition of the output voltage, and
    the voltage on the second current determination and/or voltage generation node increases while the voltage on the node of the second current follower decreases during a falling transition of the output voltage.

13. The amplifier according to claim 8, wherein
    the first current determiner comprises:
       a seventh transistor having one terminal connected to a first supply voltage; and
       a ninth transistor having one terminal connected to another terminal of the seventh transistor, a gate configured to receive a third bias voltage, and another terminal connected to a gate of the seventh transistor and one terminal of the first transmission gate, wherein the other terminal of the ninth transistor is the first current determination and/or voltage generation node,
    the first current follower comprises:
       an eighth transistor having one terminal connected to the first supply voltage, another terminal connected to one terminal of the first compensation capacitor, and a gate connected to the first current determination and/or voltage generation node; and
       a tenth transistor having one terminal connected to the other terminal of the eighth transistor, a gate configured to receive the third bias voltage, and another terminal configured to provide the first conversion voltage and connected to one terminal of the second transmission gate,
    the second current determiner comprises:
       an eleventh transistor having one terminal connected to another terminal of the first transmission gate and a gate configured to receive a fourth bias voltage, wherein the one terminal of the eleventh transistor is the second current determination and/or voltage generation node; and
       a thirteenth transistor having one terminal connected to another terminal of the eleventh transistor, another terminal connected to a second supply voltage, and a gate connected to the second current determination and/or voltage generation node, and
    the second current follower comprises:
       a twelfth transistor having one terminal configured to provide the second conversion voltage and connected to another terminal of the second transmission gate, and a gate configured to receive the fourth bias voltage; and
       a fourteenth transistor having one terminal connected to another terminal of the twelfth transistor, a gate connected to the second current determination and/or voltage generation node, and another terminal connected to the second supply voltage.

14. The amplifier according to claim 8, wherein
    each of the first current determiner and the first current follower comprises a P-type transistor, and
    each of the second current determiner and the second current follower comprises an N-type transistor.

15. The amplifier according to claim 8, wherein the slew rate improvement circuit comprises:
    a seventeenth transistor configured to connect the first conversion voltage at one terminal thereof to the output terminal in response to the first input voltage; and an eighteenth transistor configured to connect the second conversion voltage at one terminal thereof to the output terminal in response to the first input voltage.

16. The amplifier according to claim 14, wherein
the seventeenth transistor comprises a P-type transistor, and
the eighteenth transistor comprises an N-type transistor.

17. A source driver circuit comprising a buffer connecting the output terminal of the amplifier according to claim 8 to the second input terminal.

* * * * *